United States Patent
Leonard, III et al.

(10) Patent No.: US 12,159,768 B2
(45) Date of Patent: *Dec. 3, 2024

(54) CONTROLLING EXHAUST GAS PRESSURE OF A PLASMA REACTOR FOR PLASMA STABILITY

(71) Applicant: ReCarbon, Inc., Santa Clara, CA (US)

(72) Inventors: George Stephen Leonard, III, Oakland, CA (US); Stefan Andrew McClelland, San Jose, CA (US); Fei Xie, Sunnyvale, CA (US); Wei Li, San Jose, CA (US); Curtis Peter Tom, San Mateo, CA (US); Jae Mo Koo, Palo Alto, CA (US)

(73) Assignee: ReCarbon, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/790,644

(22) Filed: Feb. 13, 2020

(65) Prior Publication Data

US 2020/0312629 A1    Oct. 1, 2020

Related U.S. Application Data

(60) Provisional application No. 62/823,514, filed on Mar. 25, 2019, provisional application No. 62/823,505, (Continued)

(51) Int. Cl.
*H01J 37/32* (2006.01)
*B01J 19/12* (2006.01)
(Continued)

(52) U.S. Cl.
CPC ......... *H01J 37/32229* (2013.01); *B01J 19/12* (2013.01); *C23C 16/511* (2013.01);
(Continued)

(58) Field of Classification Search
None
See application file for complete search history.

(56) References Cited

U.S. PATENT DOCUMENTS

| 4,725,204 A | 2/1988 | Powell |
| 6,214,119 B1 | 4/2001 | Maher et al. |
| (Continued) | | |

FOREIGN PATENT DOCUMENTS

| CN | 101346032 A | 1/2009 |
| CN | 107278012 A | 10/2017 |
| (Continued) | | |

OTHER PUBLICATIONS

Machine Translation JP2017017180, Yasufumi et al (Year: 2017).*
(Continued)

*Primary Examiner* — Ram N Kackar
(74) *Attorney, Agent, or Firm* — Jason W. Croft; Buchalter

(57) ABSTRACT

The present invention provides a plasma generating system that includes: a plurality of plasma reactors. Each plurality of plasma reactors includes: a waveguide for transmitting a microwave energy therethrough; a plasma chamber coupled to the waveguide and configured to generate a plasma therein using the microwave energy; a gas inlet for introducing a gas into the plasma chamber; an exhaust gas pipe for carrying an exhaust gas from the plasma chamber, wherein the plasma converts the gas into the exhaust gas; and a pressure control device installed in the exhaust gas pipe and configured to control a pressure of the exhaust gas in the exhaust gas pipe. The plasma generating system also includes a manifold coupled to the exhaust gas pipes of the plurality of plasma reactors and configured to receive the exhaust gas from the exhaust gas pipes.

17 Claims, 9 Drawing Sheets

Related U.S. Application Data filed on Mar. 25, 2019, provisional application No. 62/823,517, filed on Mar. 25, 2019, provisional application No. 62/823,492, filed on Mar. 25, 2019, provisional application No. 62/823,436, filed on Mar. 25, 2019, provisional application No. 62/823,508, filed on Mar. 25, 2019, provisional application No. 62/823,484, filed on Mar. 25, 2019.

(51) Int. Cl.
| | | |
|---|---|---|
| *C23C 16/511* | (2006.01) | |
| *G01J 1/04* | (2006.01) | |
| *G01J 1/42* | (2006.01) | |
| *G01J 5/00* | (2022.01) | |
| *H05H 1/46* | (2006.01) | |

(52) U.S. Cl.
CPC ........... *G01J 1/0425* (2013.01); *G01J 1/0492* (2013.01); *G01J 1/4228* (2013.01); *G01J 1/429* (2013.01); *G01J 5/0018* (2013.01); *H01J 37/32449* (2013.01); *H01J 37/32623* (2013.01); *H01J 37/32844* (2013.01); *H01J 37/32972* (2013.01); *H05H 1/46* (2013.01); *F01N 2240/28* (2013.01); *H01J 37/32192* (2013.01); *H01J 37/32513* (2013.01); *H01J 2237/1502* (2013.01); *H05H 1/4622* (2021.05)

(56) References Cited

U.S. PATENT DOCUMENTS

| | | | |
|---|---|---|---|
| 6,306,765 B1 * | 10/2001 | Sato | C23C 16/08 |
| | | | 257/E21.17 |
| 9,949,356 B2 * | 4/2018 | Namburu | H05H 1/34 |
| 10,832,893 B2 | 11/2020 | McClelland et al. | |
| 10,832,894 B2 | 11/2020 | McClelland et al. | |
| 10,840,064 B2 | 11/2020 | Leonard, III et al. | |
| 10,854,429 B2 | 12/2020 | Leonard, III et al. | |
| 11,388,809 B2 | 7/2022 | Tom et al. | |
| 11,469,078 B2 | 10/2022 | Tom et al. | |
| 2002/0036065 A1 | 3/2002 | Yamagishi et al. | |
| 2003/0094135 A1 | 5/2003 | Komiya et al. | |
| 2006/0237136 A1 * | 10/2006 | Nguyen | H01J 37/3244 |
| | | | 156/345.29 |
| 2008/0011424 A1 | 1/2008 | Mn et al. | |
| 2008/0105650 A1 * | 5/2008 | Sugai | H01J 37/32192 |
| | | | 216/69 |
| 2010/0074808 A1 | 3/2010 | Lee | |
| 2011/0298376 A1 | 12/2011 | Kanegae et al. | |
| 2012/0034137 A1 | 2/2012 | Risby | |
| 2012/0192953 A1 | 8/2012 | Matsushima | |
| 2012/0204983 A1 * | 8/2012 | Nozawa | C23C 16/511 |
| | | | 137/565.01 |
| 2012/0326803 A1 | 12/2012 | Lee | |
| 2013/0045547 A1 * | 2/2013 | Izawa | H01J 37/32972 |
| | | | 438/16 |
| 2013/0236652 A1 * | 9/2013 | Belashchenko | H05H 1/34 |
| | | | 427/446 |
| 2015/0159269 A1 | 6/2015 | Nozawa et al. | |
| 2015/0246337 A1 * | 9/2015 | Hong | B01J 19/088 |
| | | | 422/186 |
| 2016/0141151 A1 * | 5/2016 | Tamura | H01J 37/32293 |
| | | | 315/111.21 |
| 2017/0032943 A1 | 2/2017 | Spaulding et al. | |
| 2018/0160617 A1 * | 6/2018 | Henry | G01F 25/00 |
| 2023/0110414 A1 | 4/2023 | Tom et al. | |

FOREIGN PATENT DOCUMENTS

| | | | |
|---|---|---|---|
| JP | 2004288482 A | | 10/2004 |
| JP | 2017017180 | * | 1/2017 |
| RU | 2252817 C1 | | 5/2005 |
| WO | WO2007/105411 A1 | | 9/2007 |
| WO | WO2013/062778 A1 | | 5/2013 |
| WO | 2015128673 A2 | | 9/2015 |
| WO | 2015128673 A3 | | 9/2015 |
| WO | 2020197702 A1 | | 10/2020 |

OTHER PUBLICATIONS

Examination Report in Indian Application No. 202117048300 mailed Apr. 5, 2022.
Examination Report in Australian Application No. 2020245142 mailed Sep. 6, 2022.
Extended European Search Report in 20777541.2 mailed Dec. 2, 2022.
Office Action issued in Russian Patent Application No. 2021130949 mailed Apr. 28, 2022.
Second Examination Report in Australian Application No. 2020245142 mailed May 8, 2023.
Singapore Search Report and Written Opinion for Singaporean Application No. 11202110046Y, dated May 31, 2024, 9 pages.
International Preliminary Report on Patentability for International Application No. PCT/US2020/020559, dated Oct. 7, 2021, 6 pages.
International Search Report and Written Opinion for International Application No. PCT/US2020/020559, dated Jun. 12, 2020, 8 pages.
Office Action for Japanese Application No. JP20210556398, dated Oct. 24, 2023, 10 pages.
Office Action for Korean Application No. 20217032454, dated Jul. 19, 2023, 09 pages.
Singapore Search Report and Written Opinion for Singaporean Application No. 11202110046Y, dated May 19, 2023, 10 pages.
Final Office Action in Korean Application No. 10-2021-7032454 mailed Feb. 20, 2024.
Office Action for Chinese Patent Application No. 202080032452.1 dated Jul. 9, 2024, 15 pgs with translation.

\* cited by examiner

CONTROLLING EXHAUST GAS PRESSURE OF A PLASMA REACTOR FOR PLASMA STABILITY

CROSS-REFERENCE TO PRIOR APPLICATIONS

This application claims priority of U.S. Patent Application Nos. 62/823,436; 62/823,492; 62/823,505; 62/823,508; 62/823,514; 62/823,517; 62/823,484; which are hereby incorporated by reference in their entirety.

BACKGROUND OF THE INVENTION

1. Field of the Invention

The present invention relates to plasma generators, and more particularly to devices for stabilizing plasma in plasma reactors.

2. Discussion of the Related Art

In recent years, microwave technology has been applied to generate various types of plasma. A conventional plasma generating system for processing/reforming gas employs multiple plasma reactors to increase the throughput of the overall system, and the gas output from each independent plasma reactor is piped or connected to a common manifold or heat exchanger. Such a conventional plasma generating system often employs a multitude of fittings, such as joints, valves, fittings as well as bends in the piping to aid in the assembly and servicing of the plasma reactors to the manifold.

Typically, this geometry, and the resulting volume in the fittings, piping and manifold, are not optimized and may generate standing waves in the reactor product gas. The standing waves may result in pressure variations in the plasma reactor chamber and cause plasma instability, where this instability may cause the plasma to extinguish itself or create less than optimal conditions for gas processing or reformation. Furthermore, there may be a crosstalk issue where a disturbance in one plasma reactor (i.e. flameout) propagates to adjacent plasma reactors in the same circuit.

As such, there is a need for microwave plasma systems that have a mechanism to control/prevent the standing waves and/or crosstalk, to thereby stabilize the plasma in the plasma reactors.

SUMMARY OF THE INVENTION

According to one aspect of the present invention, a plasma generating system that includes: a waveguide for transmitting a microwave energy therethrough; a plasma chamber coupled to the waveguide and configured to generate a plasma therein using the microwave energy; a gas inlet for introducing a gas into the plasma chamber; an exhaust gas pipe for carrying an exhaust gas from the plasma chamber, wherein the plasma converts the gas into the exhaust gas; and a pressure control device installed in the exhaust gas pipe and configured to control a pressure of the exhaust gas in the exhaust gas pipe.

According to another aspect of the present invention, a plasma generating system includes: a plurality of plasma reactors, each of the plurality of plasma reactors including: a waveguide for transmitting a microwave energy therethrough; a plasma chamber coupled to the waveguide and configured to generate a plasma therein using the microwave energy; a gas inlet for introducing a gas into the plasma chamber; an exhaust gas pipe for carrying an exhaust gas from the plasma chamber, wherein the plasma converts the gas into the exhaust gas; and a pressure control device installed in the exhaust gas pipe and configured to control a pressure of the exhaust gas in the exhaust gas pipe; and a manifold coupled to the exhaust gas pipes of the plurality of plasma reactors and configured to receive the exhaust gas from the exhaust gas pipes.

DETAILED DESCRIPTION OF THE PREFERRED EMBODIMENTS

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways.

Components, or modules, shown in diagrams are illustrative of exemplary embodiments of the disclosure and are meant to avoid obscuring the disclosure. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components.

Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. Also, the appearances of the above-noted phrases in various places in the specification are not necessarily all referring to the same embodiment or embodiments.

The use of certain terms in various places in the specification is for illustration and should not be construed as limiting. The terms "include," "including," "comprise," and "comprising" shall be understood to be open terms and any lists the follow are examples and not meant to be limited to the listed items.

Figure 1:
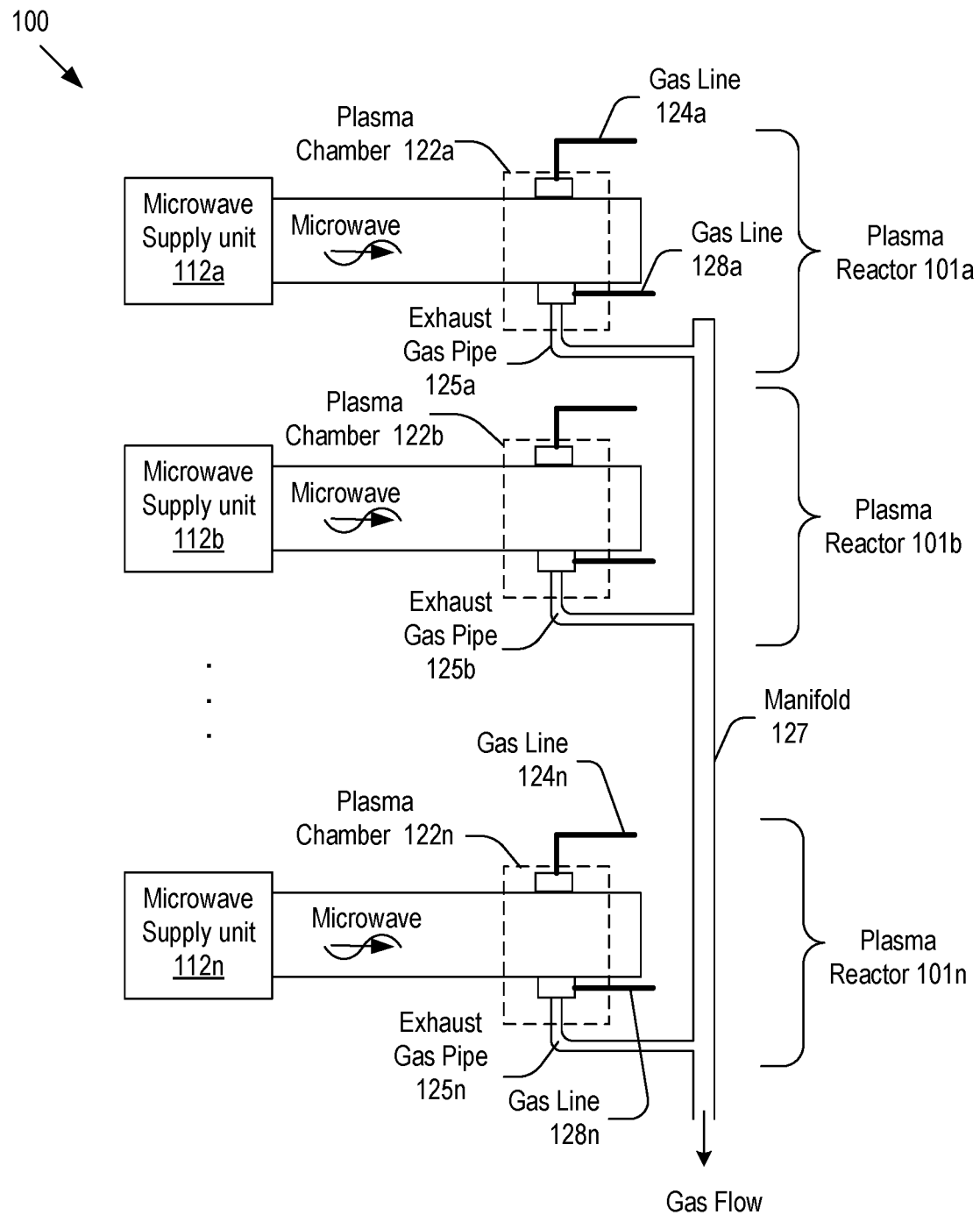
FIG. 1 shows a schematic diagram of a plasma generating system having multiple plasma reactors according to embodiments of the present disclosure.

FIG. 1 ("FIG. 1") shows a schematic diagram of a plasma generating system 100 according to embodiments of the present disclosure. As depicted, the plasma generating system 100 may include: one or more plasma reactors 101a-101n; and a manifold 127 for receiving product gas (or equivalently exhaust gas) from the plasma reactors. More specifically, the plasma generating system 100 may include: microwave supply units 112a-112n for generating microwave energy and providing the microwave energy to the plasma chambers 122a-122n, respectively; first input gas lines 124a-124n; second input gas lines 128a-128n; exhaust gas pipes 125a-125n; and the manifold 127 coupled to and in fluid communication with the exhaust gas pipes. In embodiments, each exhaust gas pipe (i.e., 125a) may carry the exhaust gas from each plasma chamber (e.g. 122a) to the manifold 127.

Figure 2:
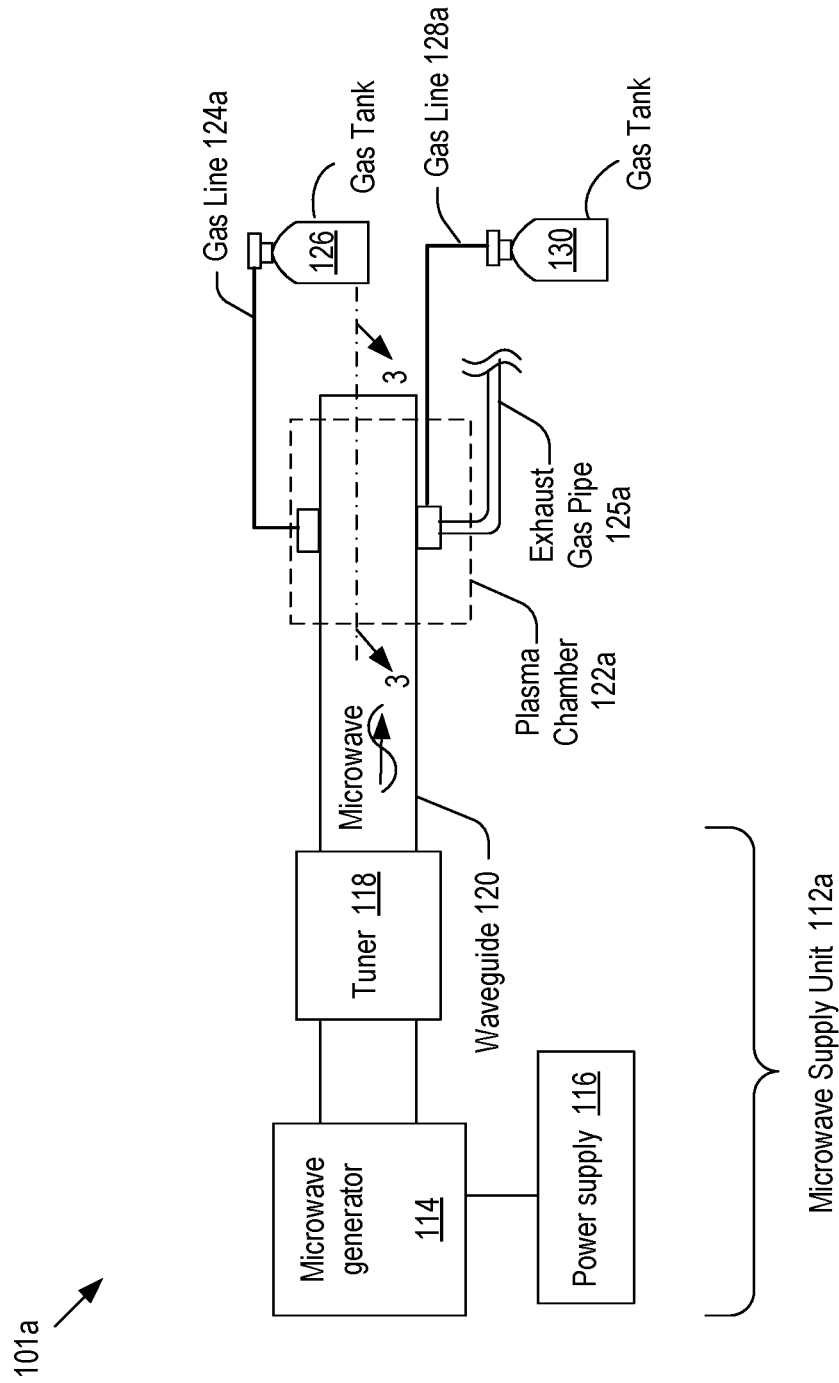
FIG. 2 shows a schematic diagram of a plasma reactor in FIG. 1 according to embodiments of the present disclosure.

FIG. 2 shows a schematic diagram of the plasma reactor 101a according to embodiments of the present disclosure. As depicted, the plasma reactor 101a may include: a microwave cavity/waveguide 120 having a shape of a hollow tube; a plasma chamber 122a connected to the waveguide 120; and a microwave supply unit 112a connected to the waveguide 120 and operative to provide microwave energy to the plasma chamber 122a via the microwave waveguide 120. In embodiments, the plasma chamber 122a receives the microwave energy and processes the input gas by use of the received microwave energy. The input gas is introduced to the plasma chamber 122a by one or both of forward flow inlet 142 and reverse flow inlet 144. In embodiments, a gas tank 126 provides gas to the plasma chamber 122a via the gas line 124a, and a gas tank 130 provides gas to the plasma chamber 122a via the gas line 128a.

In embodiments, the microwave supply unit 112a provides microwave energy to the plasma chamber 122a and includes: a microwave generator 114 for generating microwaves; a power supply 116 for supplying power to the microwave generator 114; and a tuner 118 for reducing the microwave energy reflected from the plasma chamber 122a and travelling toward the microwave generator 114. In embodiments, the microwave supply unit 112a may include other components, such as an isolator having a dummy load for dissipating reflected microwave energy that propagates toward the microwave generator 114 and a circulator for directing the reflected microwave energy to the dummy load and a sliding short circuit disposed at the end of the waveguide 120.

Figure 3:
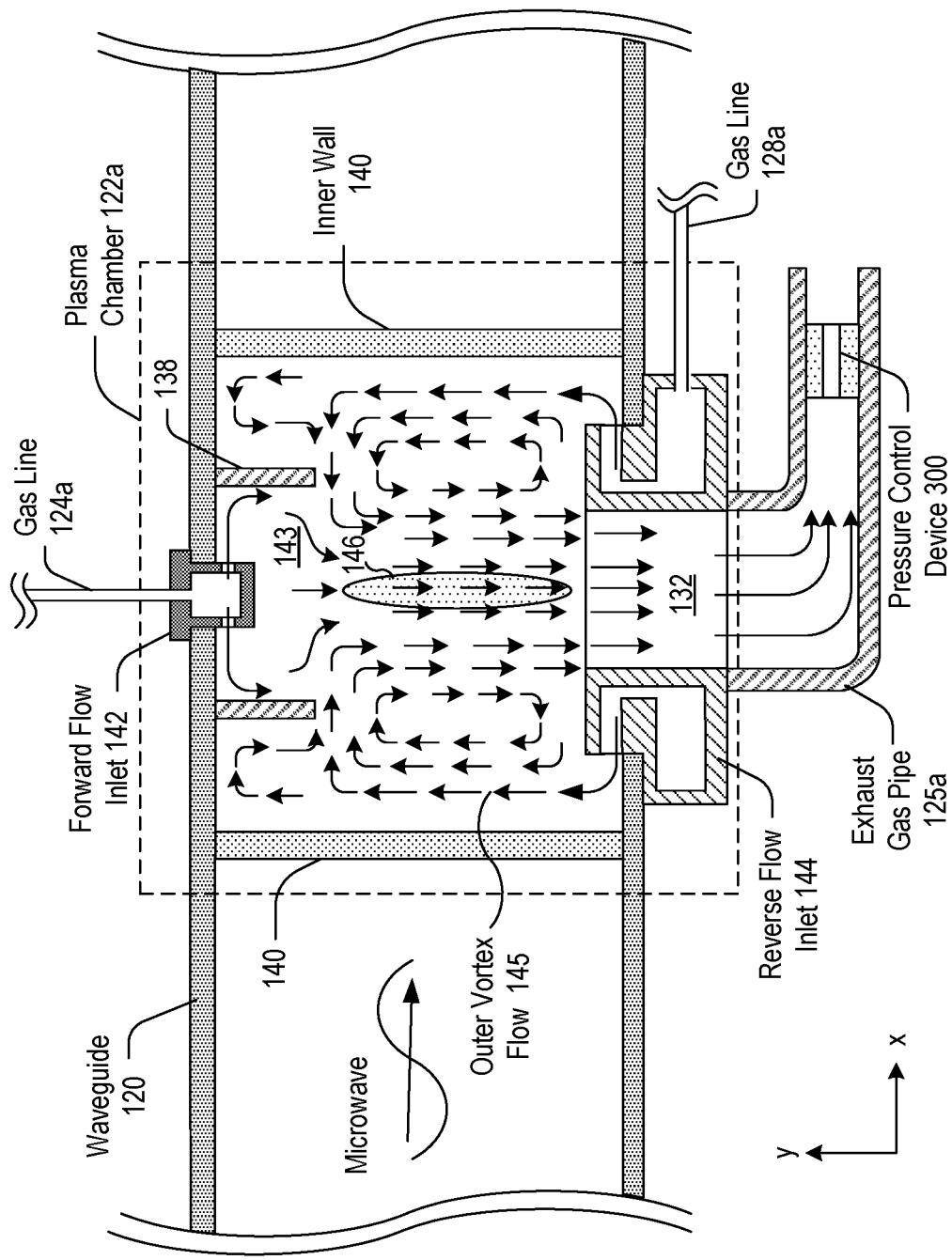
FIG. 3 shows a cross sectional view of the plasma chamber in FIG. 2, taken along the line 3-3, according to embodiments of the present disclosure.

FIG. 3 shows a cross sectional view of a plasma chamber 122a in FIG. 2, taken along the line 3-3, according to embodiments of the present disclosure. As depicted, the plasma chamber 122a includes: an inner wall(s) 140; a plasma stabilizer 138; a forward flow inlet 142 connected to the gas line 124a and configured to introduce the forward flow into the plasma chamber; and a reverse flow inlet 144 connected to the gas line 128a and configured to introduce the reverse flow into the plasma chamber. Here, the term plasma cavity refers to the enclosed space that is surrounded by the inner wall 140, waveguide 120, forward flow inlet 122 and reverse flow inlet 144, where the reverse flow gas and forward flows are processed/reformed in the plasma cavity by the plasma 146 and the plasma 146 is sustained by the microwave energy transmitted via the waveguide 120.

In embodiments, the inner wall 140 is formed of a material that is transparent to the microwave energy, such as quartz or ceramic. In embodiments, the inner wall 140 is formed of any other suitable dielectric material that is desirable for uniform flow, thermal resistance, chemical resistance, and electromagnetic transparency. In embodiments, the inner wall 140 has preferably, but not limited to, a shape of hollow circular cylinder.

Figure 4:
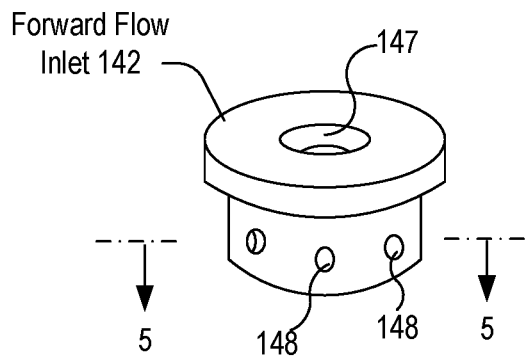
FIG. 4 shows a perspective view of a forward flow inlet according to embodiments of the present disclosure.
Figure 5:
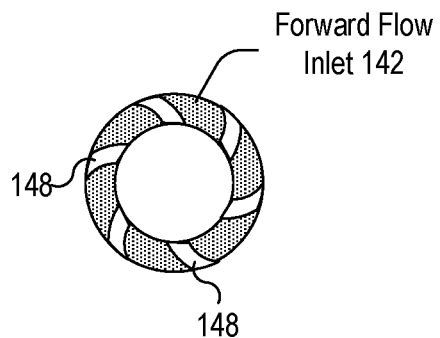
FIG. 5 shows a cross sectional view of the forward flow inlet in FIG. 4, taken along the line 5-5, according to embodiments of the present disclosure.

FIG. 4 shows a perspective view of the forward flow inlet 142 according to embodiments of the present disclosure. FIG. 5 shows a cross sectional view of the forward flow inlet 142, taken along the line 5-5, according to embodiments of the present disclosure. As depicted, the forward flow inlet 142 has a hole/adaptor 147 for coupling to the gas line 124 and one or more gas passageways 148 that are formed in the wall thereof. In embodiments, the exits of the gas passageways 148 are located inside the plasma stabilizer 138 so that the plasma stabilizer 138 forms an inner vortex flow 143 using the flow exiting the gas passageways 148. In embodiments, the inner diameter of the plasma stabilizer 138 may be varied to adjust the outer diameter of the inner vortex flow 143. In embodiments, as discussed above, the plasma stabilizer 138 may have a shape of hollow circular cylinder and disposed concentrically to the forward flow inlet 142.

In embodiments, each gas passageway 148 is arranged to impart spiral motion to the forward flow as the forward flow enters the plasma cavity via the gas passageway 148. In embodiments, each gas passageway 148 may be curved to enhance the vorticity of the forward flow.

Figure 8:
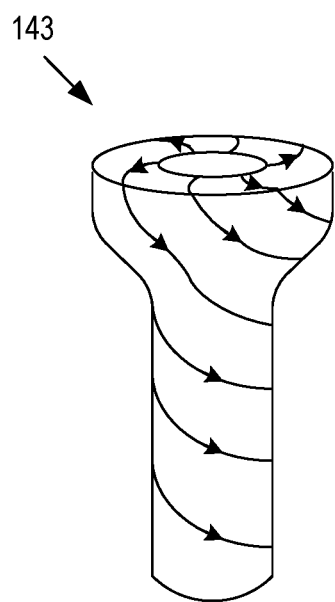
FIG. 8 shows a perspective view of an inner vortex flow according to embodiments of the present disclosure.

In embodiments, the plasma stabilizer 138 is formed of material that is transparent to the microwave energy, and preferably formed of the same material as the inner wall 140. In embodiments, the plasma stabilizer 138 is attached to the waveguide 120, protruding into the plasma cavity, where the axial direction of the plasma stabilizer 138 is parallel to the y-axis. In embodiments, as discussed above, the inner wall 140 may have a shape of a hollow circular cylinder and the plasma stabilizer 138 may be installed concentrically to the inner wall 140. In embodiments, the forward flow inside the plasma stabilizer 138 forms the inner vortex flow 143 and proceeds toward the other end of the waveguide 120, more specifically toward the gas outlet 132. FIG. 8 shows a perspective view of the inner vortex flow 143 according to embodiments of the present disclosure. As depicted, the forward flow (or equivalently, inner vortex flow) travels the length of the inner wall 140 in a helical motion until the inner vortex flow exits the gas outlet 132.

In embodiments, upon ignition of a plasma plume (or shortly, plasma) 146 by a plasma igniter (not shown in FIG. 3), the plasma 146 is sustained by the microwave energy transmitted by the microwave generator 114. In embodiments, the plasma 146 is located within the inner vortex flow 143 so that the gas particles of the inner vortex flow 143 pass through the plasma 146. In embodiments, the plasma stabilizer 138 determines the outer diameter of the inner vortex flow 143, preventing the forward flow from bypassing the plasma 146 before exiting the plasma cavity through the gas outlet 132. In embodiments, the plasma stabilizer 138 aids in keeping the plasma 146 stable by separating the inner vortex flow 143 from the outer vortex flow 145.

Figure 6:
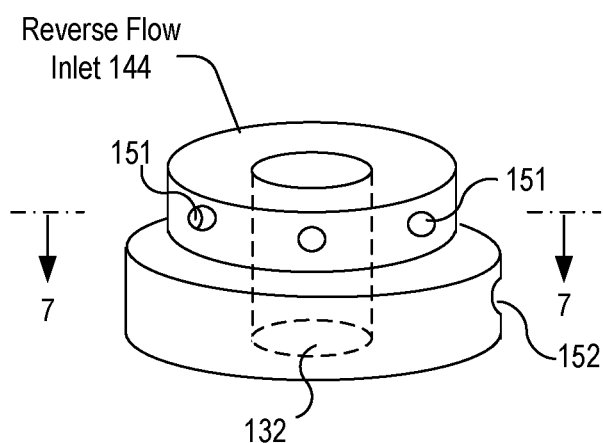
FIG. 6 shows a perspective view of a reverse flow inlet according to embodiments of the present disclosure.
Figure 7:
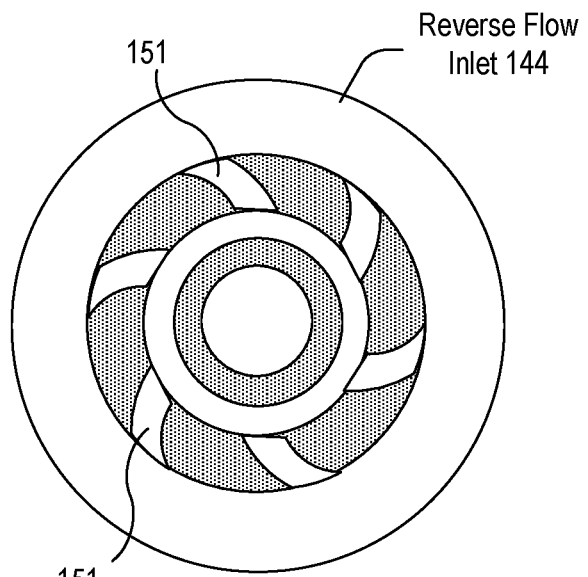
FIG. 7 shows a cross sectional view of the reverse flow inlet in FIG. 6, taken along the line 7-7, according to embodiments of the present disclosure.

FIG. 6 shows a perspective view of the reverse flow inlet 144 according to embodiments of the present disclosure. FIG. 7 shows a cross sectional view of the reverse flow inlet 144, taken along the line 7-7, according to embodiments of the present disclosure. As depicted, the reverse flow inlet 144 has a hole/adaptor 152 for coupling to the gas line 128a, a hole to form the gas outlet 132, and one or more gas passageways 151 that are formed in the wall thereof. In embodiments, each gas passageway 151 is arranged to impart spiral motion to the reverse flow as the reverse flow enters the plasma cavity via the gas passageway 151. In embodiments, each gas passageway 151 may be curved to enhance the vorticity of the reverse flow.

Figure 9:
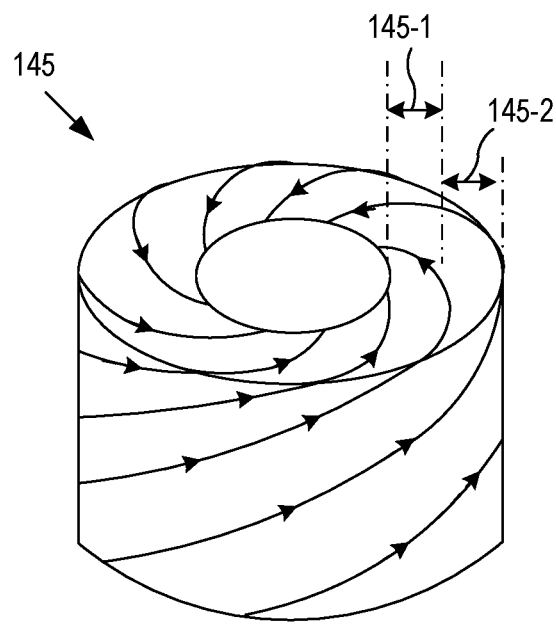
FIG. 9 shows a perspective view of an outer vortex flow according to embodiments of the present disclosure.

In embodiments, the reverse flow exiting the reverse flow inlet 144 travels toward to the inner wall 140 and then proceeds upwardly (y-axis direction) toward the other end of the waveguide 120 along the inner wall 140 in a helical motion. Subsequently, the reverse flow reverses the flow direction to proceed downwardly and form an outer vortex flow 145. In embodiments, the rotational axis of the outer vortex flow 145 is substantially parallel to the y-axis. FIG. 9 shows a perspective view of the outer vortex flow 145 according to embodiments of the present disclosure. As depicted, the outer vortex flow 145 has a hollow cylinder shape and has two flow regions: inner downward flow region 145-1 and an outer upward flow region 145-2. In embodiments, the inner vortex flow 143 is disposed in the middle hollow portion of the outer vortex flow 145 and surrounded by inner downward flow region 145-1.

In embodiments, the outer vortex flow 145 surrounds the inner vortex flow 143, to thereby shield the inner wall 140 from the plasma 146. In embodiments, the reverse flow exiting the reverse flow inlet 144 may have the ambient temperature and take heat energy from the inner wall 140 as the outer vortex flow 145 travels upwardly along the inner wall 140 in the helical motion.

In embodiments, as discussed above, the inner diameter of the plasma stabilizer 138 determines the radial dimension of the inner vortex flow 143. As such, in embodiments, the inner diameter of the plasma stabilizer 138 may be adjusted so that the outer vortex flow 145 surrounds the inner vortex flow 143 and maintain the flow regime of the inner vortex flow 143 in a stable manner to thereby stabilize the plasma and yield improved throughput and efficiency In embodiments, the plasma 146 is used to reform the inlet gas to the desired product gas, where the inlet gas is introduced into the plasma cavity by one or both the forward flow inlet 142 and the reverse flow inlet 144. In embodiments, the gas composition of the inner vortex flow exiting the forward flow inlet 142 includes $CO_2$, $CH_4$ and $O_2$, and the gas exiting the gas outlet 132 includes CO and $H_2$ as well as a non-reacted portion of forward flow gas. In embodiments, the distribution for the forward flow is 0%-100% by mass of the total flow into the plasma chamber 122a. In embodiments, the reverse flow may have the same gas composition of the forward flow. In alternative embodiments, the forward flow may have different gas composition from the reverse flow. In embodiments, the gas compositions and flow rates of the forward and reverse flows may be adjusted to enhance the plasma stability and efficiency of the chemical reaction in the plasma chamber 122a.

Figure 10A:
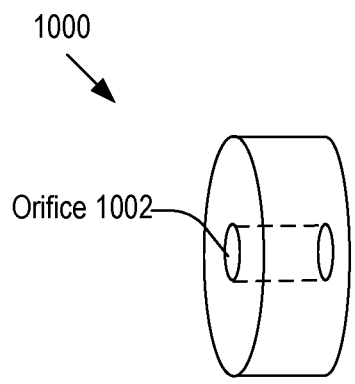
FIG. 10A shows a perspective view of a pressure control device according to embodiments of the present disclosure.

As depicted in FIG. 3, a pressure control device 300 may be installed within the exhaust gas pipe 125a to adjust the pressure of exhaust gas exiting from the plasma chamber 122a, creating a back-pressure within the plasma chamber. In embodiments, the pressure control device 300 may limit/change the cross sectional area of the exhaust gas pipe 125a (i.e., the pressure control device 300 may provide the flow impedance) to dampen the pressure wave propagating through the exhaust gas pipe. FIG. 10A shows a perspective view of a pressure control device 1000 according to embodiments of the present disclosure. In embodiments, the pressure control device 1000 may be used as the pressure control device 300 in FIG. 3. In the present disclosure, for the purpose of illustration, it is assumed that the cross sectional shape of the exhaust gas pipe (e.g. 125a) is a circle, while the exhaust gas pipe may have other suitable cross sectional shapes, such as oval or rectangle.

As depicted in FIG. 10A, the pressure control device 1000 may have a shape of a flat disk, where an orifice (or equivalently hole) 1002 is formed therein. The dimension of the orifice 1002 may be changed to vary the obstruction geometry, to thereby control the amount of back-pressure in the plasma chamber and to optimize the stability of the plasma 146. In embodiments, a wave, such as standing wave, may be formed in the exhaust gas pipe 125a and/or the manifold 127, where the wave may be associated with the time-varying pressure fluctuations. In embodiments, the pressure control device 1000 may control/modulate the time-varying pressure fluctuations in the exhaust gas pipe 125a, to thereby optimize the stability of the plasma 146.

If the pressure control device 1000 is not used, a pressure disturbance in one plasma chamber (e.g. 122a) may propagate to another plasma chamber (e.g. 122b) through the exhaust gas pipe 125a, manifold 127, and exhaust gas pipe 125b, i.e., a crosstalk may occur between two or more plasma chambers. In embodiments, the pressure control device 1000 may also suppress the crosstalk, to enhance the plasma stability.

It should be apparent to those of ordinary skill in the art that the pressure control device 1000 may include more than one orifice to optimize the pressure in the exhaust gas pipe 125a and the back-pressure in the plasma chamber 122a while suppressing the propagation of pressure fluctuations/disturbances through the exhaust gas pipe 125a.

Figure 10B:
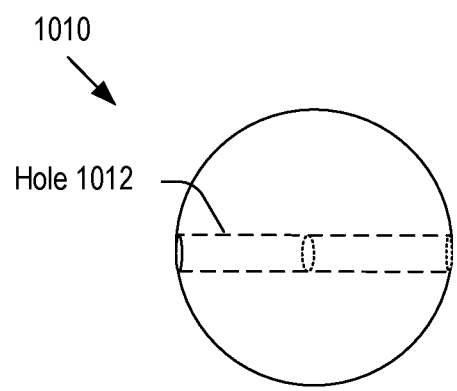
FIG. 10B shows a perspective view of a pressure control device according to embodiments of the present disclosure.

In embodiments, the pressure control device 300 may have other suitable shapes, as shown in FIGS. 10B-10G. FIG. 10B shows a pressure control device 1010 according to embodiments of the present disclosure. As depicted in FIG. 10B, the pressure control device 1010 may be a sphere that has one or more holes 1012. In embodiments, the diameter of the pressure control device 1010 may be the same as the inner diameter of the exhaust gas pipe 125a. In embodiments, the size and number of holes 1012 may be changed to optimize the pressure in the exhaust gas pipe 125a and the back-pressure in the plasma chamber 122a while suppressing the propagation of pressure fluctuations/disturbances.

Figure 10C:
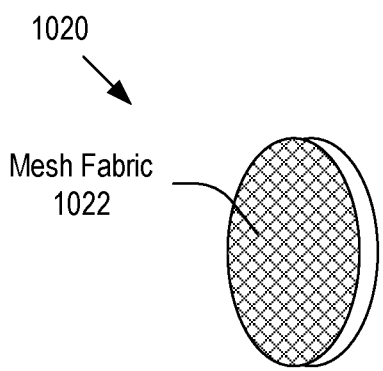
FIG. 10C shows a perspective view of a pressure control device according to embodiments of the present disclosure.

FIG. 10C shows a pressure control device 1020 according to embodiments of the present disclosure. As depicted in FIG. 10C, the pressure control device 1020 may be formed of a mesh fabric 1022, where the mesh fabric may be formed of suitable material, such as metallic, non-metallic, or both. In embodiments, the strands of the mesh fabric 1022 may be entangled or have a grid-like structure, and the size of the strands and spacing between the strands may be changed to optimize the pressure in the exhaust gas pipe 125a and the back-pressure in the plasma chamber 122a while suppressing the propagation of pressure fluctuations/disturbances through the exhaust gas pipe 125a.

Figure 10D:
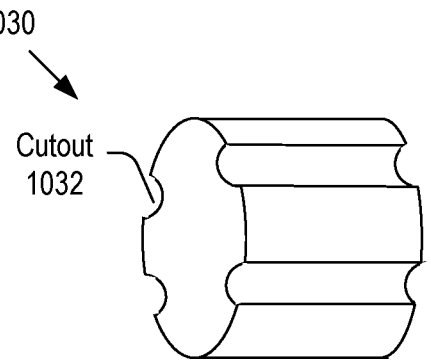
FIG. 10D shows a perspective view of a pressure control device according to embodiments of the present disclosure.

FIG. 10D shows a pressure control device 1030 according to embodiments of the present disclosure. As depicted in FIG. 10D, the pressure control device 1030 may be a flat disk having one or more edge cutouts/grooves 1032 may be formed along the side surface of the disk. As in the pressure control device 1000, the size and number of the edge cutouts 1032 may be changed to optimize the pressure in the exhaust gas pipe 125a and the back-pressure in the plasma chamber 122a while suppressing the propagation of pressure fluctuations/disturbances through the exhaust gas pipe 125a.

Figure 10E:
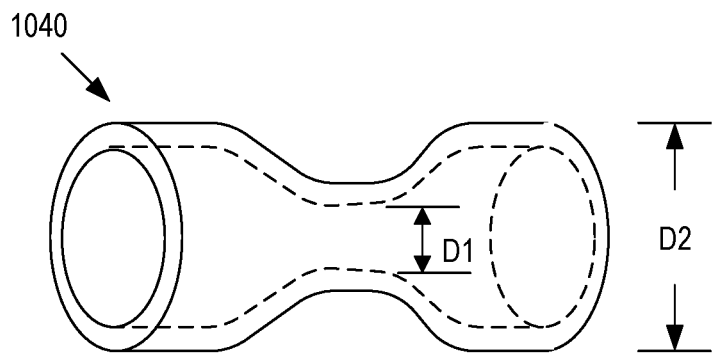
FIG. 10E shows a perspective view of a pressure control device according to embodiments of the present disclosure.

FIG. 10E shows a pressure control device 1040 according to embodiments of the present disclosure. As depicted in FIG. 10E, the pressure control device 1040 may a tube, where the cross sectional dimension of the tube may vary along the axial direction thereof. In embodiments, the outer diameter D2 of the tube at its both ends may be the same as the inner diameter of the exhaust gas pipe 125a. In embodiments, the minimum inner diameter D1 of the tube 1040 may be changed to optimize the pressure in the exhaust gas pipe 125a and the back-pressure in the plasma chamber 122a while suppressing the propagation of pressure fluctuations/disturbances through the exhaust gas pipe 125a.

Figure 10F:
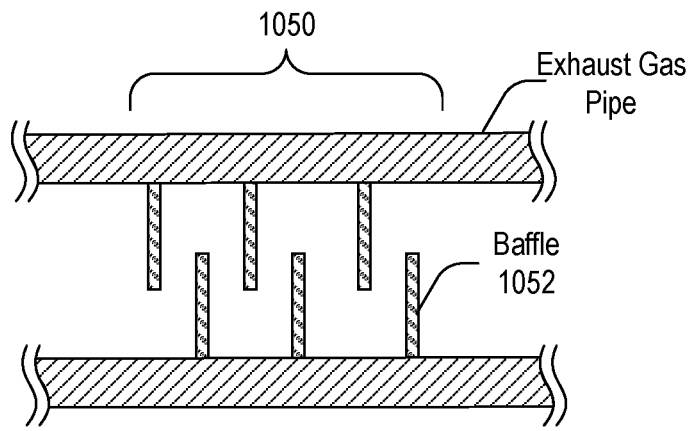
FIG. 10F shows a perspective view of a pressure control device according to embodiments of the present disclosure.
Figure 10G:
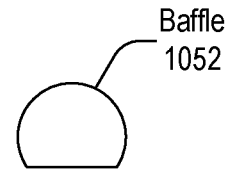
FIG. 10G shows a front view of the pressure control device in FIG. 10F according to embodiments of the present disclosure.

FIG. 10F shows a pressure control device 1050 according to embodiments of the present disclosure. As depicted, the pressure control device 1050 may include a series of baffles 1052 that are secured to the inner surface of the exhaust gas pipe 125a. FIG. 10G shows a front view of the baffle 1052 according to embodiments of the present disclosure. In embodiments, the number and shape of the baffles 1052 may be changed to optimize the pressure in the exhaust gas pipe 125a and the back-pressure in the plasma chamber 122a while suppressing the propagation of pressure fluctuations/disturbances through the exhaust gas pipe 125a.

Figure 11:
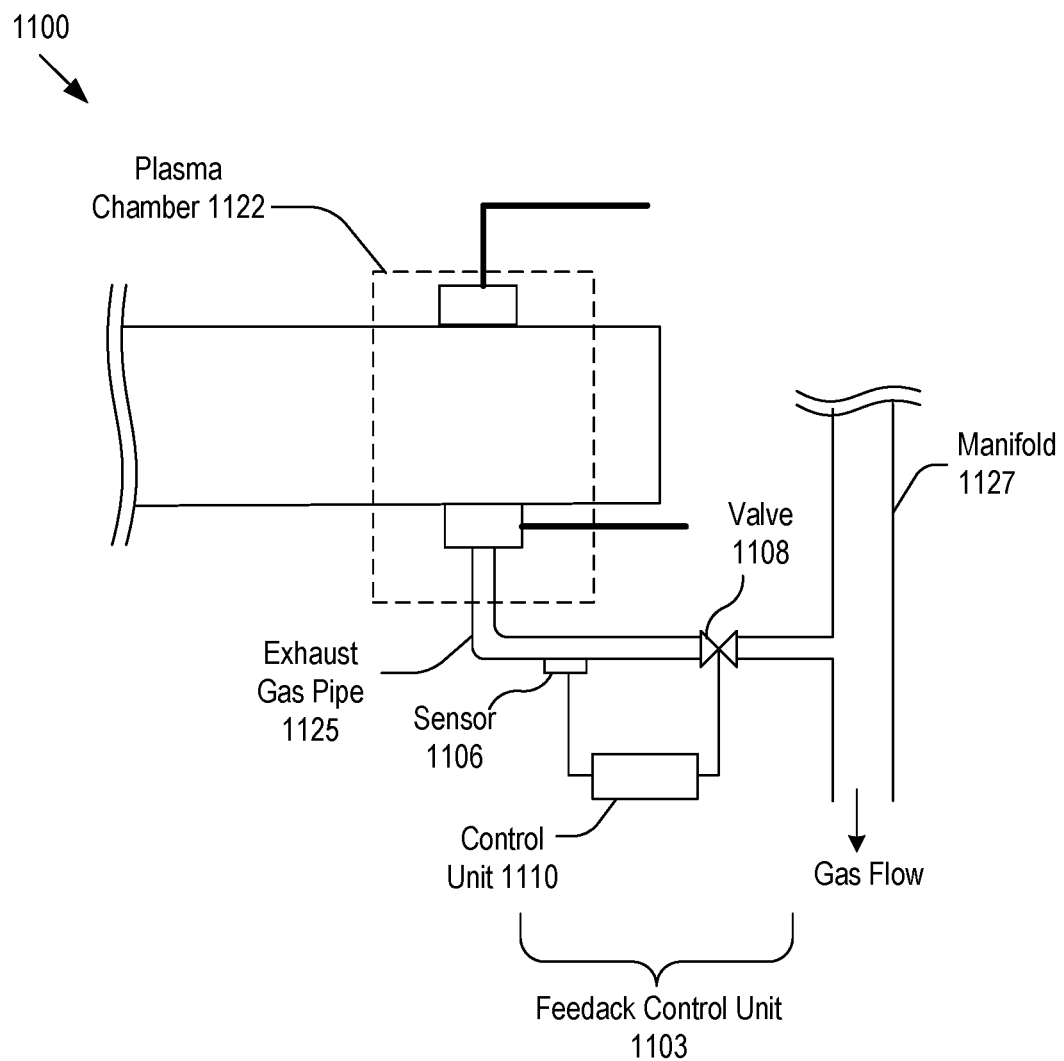
FIG. 11 shows a schematic diagram of a plasma reactor according to embodiments of the present disclosure.

FIG. 11 shows a schematic diagram of a plasma reactor 1100 according to embodiments of the present disclosure. As depicted, the plasma reactor 1100 may be similar to the plasma reactor 101a, with the difference that a feedback control unit 1103 may be used to control the pressure in the exhaust gas pipe 1125. In embodiments, the feedback control unit 1103 may include: a sensor 1106, such as a pressure transducer, for measuring the gas pressure in the exhaust gas pipe 1125; a valve 1108, such as variable orifice valve, for controlling the gas pressure in the exhaust gas pipe 1125; and a control unit 1110 coupled to and configured to control the sensor 1106 and the valve 1108. In embodiments, the control unit 1110, which may be a computing device, may receive the signal from the sensor 1106 and, in response to the signal, control the valve 1108 to adjust the pressure through the exhaust gas pipe 1125, to thereby optimize the pressure in the exhaust gas pipe 1125 and the back-pressure in the plasma chamber 1122 while suppressing the propagation of pressure fluctuations/disturbances through the exhaust gas pipe 1125.

In embodiments, each of the plasma reactors 101a-101n may have the feedback control unit 1103. In alternative embodiments, each of the plasma reactors 101a-101n may have the sensor 1106 and the valve 1108, while the sensors and valves of the plasma reactors are controlled by one control unit 1110, i.e., the exhaust gas pressures are controlled by one centralized control unit.

Figure 12:
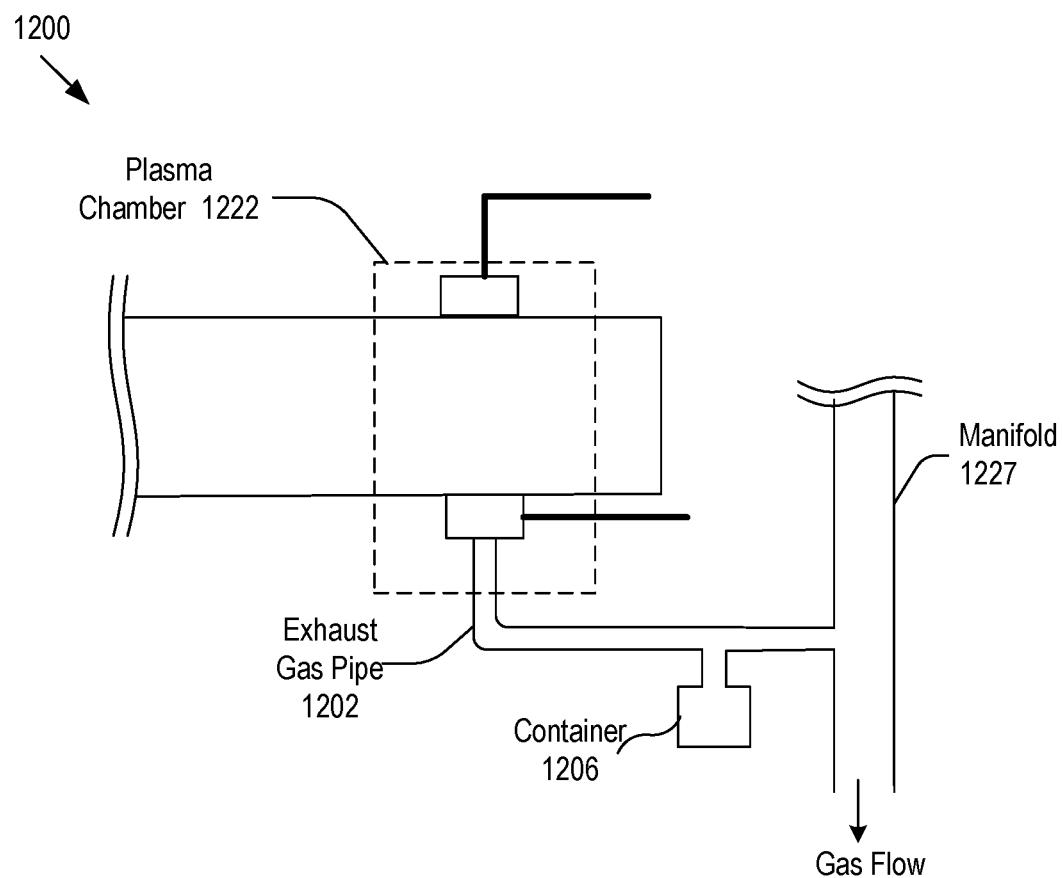
FIG. 12 shows a schematic diagram of a plasma reactor according to embodiments of the present disclosure.

FIG. 12 shows a schematic diagram of a plasma reactor 1200 according to embodiments of the present disclosure. As depicted, the plasma reactor 1200 may be similar to the plasma reactor 101a, with the difference that a container 1206 may be attached to and in fluid communication with an exhaust gas pipe 1202, where container 1206 may be used to disrupt or shift the frequency of standing wave in the exhaust gas pipe 1202, to thereby improve plasma stability and/or attenuate crosstalk between plasma reactors through the manifold 1227.

It is noted that the plasma chamber 122a in FIG. 3 may have different components and arrangement of the components. For instance, the plasma chamber may not include the forward flow inlet 142. In another example, the plasma stabilizer 138 may be mounted on the reverse flow inlet 144. The description of various embodiments of the plasma chamber 122a can be found in a copending U.S. patent application Ser. No. 16/752,689, entitled "Plasma reactor for processing gas," filed on Jan. 26, 2020, which is hereby incorporated by reference in its entirety.

Figure 13:
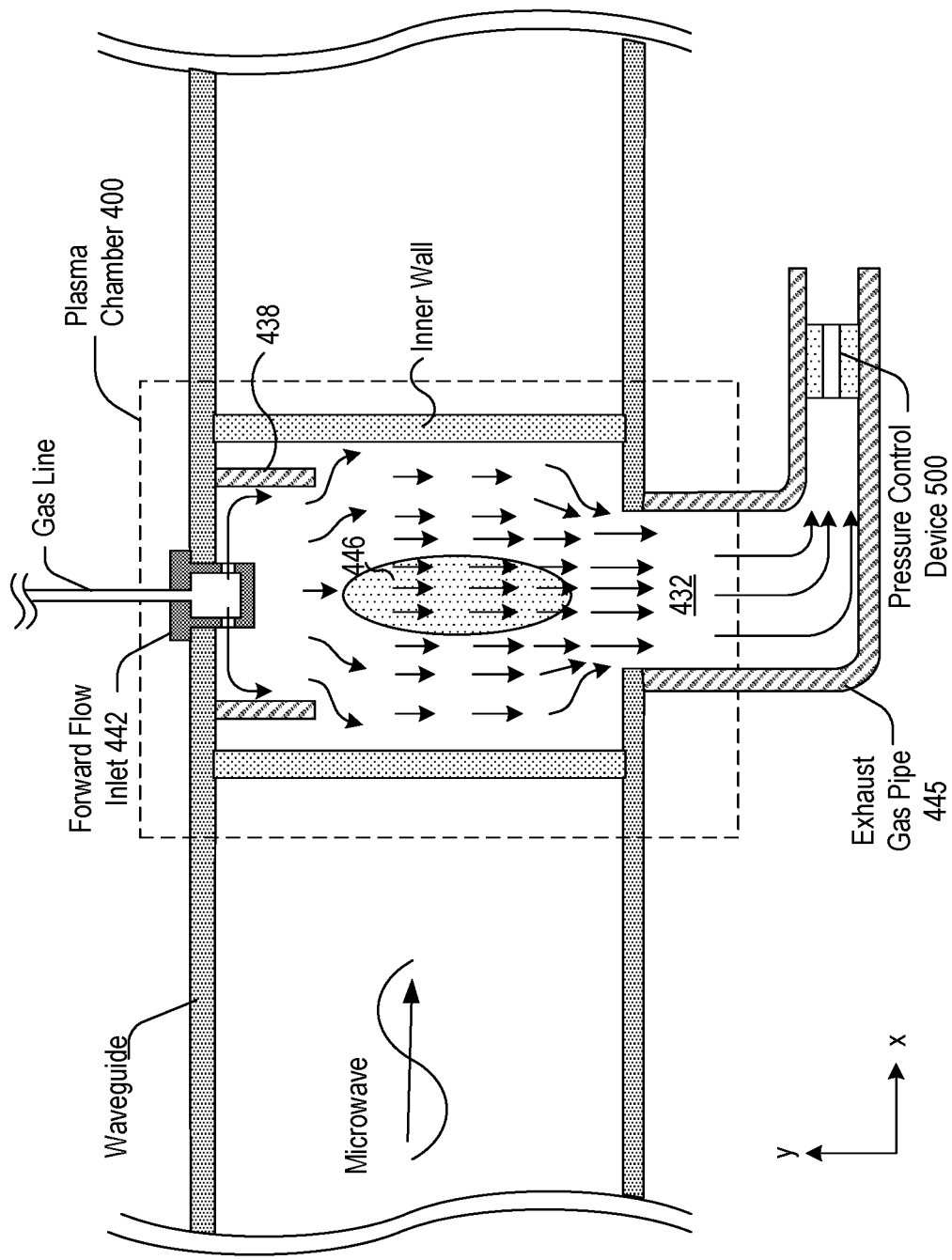
FIG. 13 shows a cross sectional view of a plasma chamber according to embodiments of the present disclosure.

In embodiments, the plasma chamber 122a in FIG. 3 may not include the reverse flow inlet 144. FIG. 13 shows a cross sectional view of a plasma chamber 400 according to embodiments of the present disclosure. In embodiments, the plasma chamber 400 may be used for the plasma reactors in FIG. 1. As depicted, the plasma chamber 400 includes the forward flow inlet 442 that has the similar structures and functions as the forward flow inlet 142 in FIG. 3, but the plasma chamber 400 does not include a reverse flow inlet. In embodiments, the plasma stabilizer 438 is an optional components. In embodiments, the gas processed by the plasma 446 exits through the gas outlet 432, and the pressure control device 500 installed in the exhaust gas pipe 445 has the similar structures and functions as the pressure control device 300.

As discussed above, each of the plasma reactors 101a-101n in FIG. 1 may use the pressure control devices in FIGS. 10A-10G. Also, the feedback control unit 1103 in FIG. 11 and the chamber 1206 in FIG. 12 may be used to improve plasma stability and attenuate crosstalk between plasma reactors through the manifold 127. Thus, it should be apparent to those of ordinary skill in the art that each of the plasma reactors in FIG. 1 may use one or more of the pressure control devices in FIGS. 10A-10G, the feedback control unit 1103 in FIG. 11 and the chamber 1206 in FIG. 12. Similarly, it should be apparent to those of ordinary skill in the art that each of the plasma chamber in FIG. 13 may use one or more of the pressure control devices in FIGS. 10A-10G, the feedback control unit 1103 in FIG. 11 and the chamber 1206 in FIG. 12.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A plasma generating system, comprising:
a plasma chamber coupled to a waveguide and configured to generate a plasma therein using the microwave energy;
the waveguide having an inner wall enclosing the plasma chamber;
a plasma stabilizer;
a forward flow inlet and a reverse flow inlet for introducing input gases into the plasma chamber, the forward flow inlet having a gas passageway being shaped to contribute to an inner vortex flow and the reverse flow inlet to contribute to an outer vortex flow within the plasma chamber;
an exhaust gas pipe for carrying an exhaust gas from the plasma chamber, wherein the plasma converts the input gas into the exhaust gas; and
a stationary pressure control device installed in the exhaust gas pipe, the stationary pressure control device having a cylindrical orifice formed therethrough, the cylindrical orifice being shaped configured to control a pressure of the exhaust gas in the exhaust gas pipe,
wherein the plasma stabilizer is protruding into a plasma cavity that is surrounded by the inner wall, the waveguide, the forward flow inlet and the reverse flow inlet coupled to the plasma chamber.

2. The plasma generating system as recited in claim 1, wherein the pressure control device is a disk.

3. The plasma generating system as recited in claim 1, wherein the pressure control device is a sphere having at least one hole through which the exhaust gas passes.

4. The plasma generating system as recited in claim 1, wherein the pressure control device includes a mesh fabric.

5. The plasma generating system as recited in claim 1, wherein the pressure control device is a disk having one or more edge cutouts.

6. The plasma generating system as recited in claim 1, wherein the pressure control device is a tube and a diameter of the tube varies along a downstream direction of the tube.

7. The plasma generating system as recited in claim 1, further comprising a second flow inlet configured as a reverse flow inlet.

8. The plasma generating system as recited in claim 1, the forward flow inlet having at least two gas passageways being shaped to contribute to the vortex flow within the plasma chamber.

9. The plasma generating system as recited in claim 8, further comprising a second flow inlet configured as a reverse flow inlet, the reverse flow inlet having at least two gas passageways being shaped to contribute to the vortex flow within the plasma chamber.

10. A plasma generating system, comprising:
a plurality of plasma reactors, each of the plurality of plasma reactors including:
a waveguide for transmitting a microwave energy therethrough,
a plasma stabilizer;
a plasma chamber coupled to the waveguide, the waveguide having an inner wall enclosing the plasma chamber;
a forward flow inlet and a reverse flow inlet for introducing input gases into the plasma chamber, the forward flow inlet having a gas passageway being shaped to contribute to an inner vortex flow and the reverse flow inlet to contribute to an outer vortex flow within the plasma chamber;
an exhaust gas pipe for carrying an exhaust gas from the plasma chamber, wherein the plasma converts the gas into the exhaust gas; and
a pressure control device installed in the exhaust gas pipe and configured to control a pressure of the exhaust gas in the exhaust gas pipe; and
a manifold coupled to the exhaust gas pipes of the plurality of plasma reactors and configured to receive the exhaust gas from the exhaust gas pipes,
wherein a first plasma reactor of the plurality of plasma reactors having a first stationary pressure control device that is shaped to reduce crosstalk between the first plasma reactor and at least one other plasma reactor of the plurality of plasma reactors,
wherein the plasma stabilizer is protruding into a plasma cavity that is surrounded by the inner wall, the waveguide, the forward flow inlet and the reverse flow inlet coupled to the plasma chamber.

11. The plasma generating system as recited in claim 10, wherein the pressure control device is a disk.

12. The plasma generating system as recited in claim 10, wherein the pressure control device is a sphere having at least one hole through which the exhaust gas passes.

13. The plasma generating system as recited in claim 10, wherein the pressure control device includes a mesh fabric.

14. The plasma generating system as recited in claim 10, wherein the pressure control device is a disk having one or more edge cutouts.

15. The plasma generating system as recited in claim 10, wherein the pressure control device is a tube and a diameter of the tube varies along a downstream direction of the tube.

16. The plasma generating system as recited in claim 10, wherein the flow inlet for introducing the gas into the plasma chamber includes a forward flow inlet.

17. The plasma generating system as recited in claim 16, further comprising a second flow inlet configured as a reverse flow inlet.

* * * * *